United States Patent [19]
Signell et al.

[11] Patent Number: 6,032,166
[45] Date of Patent: Feb. 29, 2000

[54] PROGRAMMABLE ANALOG BANDPASS FILTERING APPARATUS AND METHOD AND DESIGN METHOD FOR A DISCRETE TIME FILTER

[75] Inventors: Svante Signell, Vällingby; Thorsten Schier, Uppsala, both of Sweden

[73] Assignee: Telefonaktiebolaget LM Ericsson, Stockholm, Sweden

[21] Appl. No.: 09/021,181

[22] Filed: Feb. 10, 1998

[30] Foreign Application Priority Data

Feb. 10, 1997 [SE] Sweden ................................ 970045

[51] Int. Cl.[7] ................................ G06J 1/00; G06F 17/10
[52] U.S. Cl. ................................ 708/3; 708/300
[58] Field of Search ................ 708/3, 819, 300–322, 708/323; 375/229–235

[56] References Cited

U.S. PATENT DOCUMENTS 4,232,269  11/1980  Willoner .
5,949,820   9/1999  Shih et al. .............................. 375/229

FOREIGN PATENT DOCUMENTS 0 489 281  6/1992  European Pat. Off. .
1 555 825  4/1988  U.S.S.R. .

OTHER PUBLICATIONS

Ajose, S.O. et al., "Design of Digital Elliptic Bandpass Filter", Int. J. Electronics, vol. 69, No. 5, p. 657–663, 1990.

Green, B.D. et al., "Digital Bilinear Idi Ladder Filters Using Lattice Equivalents and Wave Concepts", IEEE International Symposium on Circuits and Systems, vol. 1, pp. 539–542, Jul. 1988 (Finland).

IEEE International Symposium on Circuits an Systems Proceedings, vol. 3 of 3, pp. 1017–1020, Montreal, Canada, May 7–10, 1984.

Signell, S.et al., "Design and Analysis of Bilinear Digital Ladder Filters", IEEE CAS–1, vol. 43, Feb. 1996.

Shpak, Dale J., "Analytical Design of Biquadratic Filter Sections For Parametric Filters", J. Audio Eng. Soc., vol. 40, No. 11, pp. 876–885, Nov. 1992.

Trapp, Mike, "Learn the Fundamentals of Digital Filter Design", Electronic Design, vol. 39, No. 14, pp. 83,84,86, 90–92, and 95, Jul. 1991.

*Primary Examiner*—Tan V. Mai
*Attorney, Agent, or Firm*—Burns, Doane, Swecker & Mathis, L.L.P.

[57] ABSTRACT

A desired programmable complex analog bandpass filter is replaced by a "black box" that receives an analog continuous-time signal and delivers an analog continuous-time signal, just as the analog filter would, but internally realizes the programmability with a programmable discrete-time system. The transfer function of the "black box" is the same as the transfer function of the analog filter. The "black box" includes an anti-aliasing filter, an A/D-converter, a complex digital bandpass filter (16), a D/A-converter (18) and an anti-imaging filter (20).

13 Claims, 8 Drawing Sheets

PROGRAMMABLE ANALOG BANDPASS FILTERING APPARATUS AND METHOD AND DESIGN METHOD FOR A DISCRETE TIME FILTER

TECHNICAL FIELD

The present invention relates to a programmable bandpass filtering apparatus and method for filtering an analog continuous-time input signal into an analog continuous-time output signal. The invention also relates to a design method for a discrete time filter that is part of such an apparatus.

BACKGROUND

Realizing a programmable complex analog bandpass filter with arithmetic symmetry (the filter transfer function is symmetric around the programmable center frequency $\omega_0$) is very difficult. Programmability of such a filter means that the characteristics of a physical component of the filter, for example the resistance of a resistor must be controlled. As an example of the difficulties, see citation [1], which describes an analog programmable real filter in which an effective resistance value (which determines the center frequency of the filter) is obtained by controlling the time a resistor is connected or disconnected in the filter.

On the other hand, programmability of digital or time-discrete filter is easy to obtain by varying the filter coefficients. An example is shown in citation [2].

Citation [3] describes an analog filter that is implemented by a cascade of an anti-aliasing filter, an A/D-converter a real digital filter, a D/A converter and an anti-imaging filter. Such a real digital filter is, however, not capable of providing arithmetic symmetry.

SUMMARY

It is an object of the present invention to provide a complex programmable analog bandpass filtering apparatus and method which allow utilization of the easy programmability of discrete-time filters, as well as a design method for such a discrete-time filter.

This object is solved by an apparatus and a methods in accordance with the enclosed claims.

Briefly, the present invention solves the above object by replacing the desired programmable complex bandpass filter with a "black box" that receives an analog continuous-time signal and delivers an analog continuous-time signal, just as the analog filter would, but internally realizes the programmability with a programmable discrete-time system. The transfer function of the "black box" is the same as the transfer function of the analog filter. Inside the "black box" there is a discrete-time filter that is implemented by transforming a continuous-time prototype lowpass filter into a complex discrete-time filter. This transformation involves a linear frequency shift that preserves the desired arithmetic symmetry of the lowpass filter.

BRIEF DESCRIPTION OF THE DRAWINGS

The invention, together with further objects and advantages thereof, may best be understood by making reference to the following description taken together with the accompanying drawings, in which.

DETAILED DESCRIPTION

Before the present invention will be described in more detail a few terms used throughout the specification and claims will be defined.

A filter is considered "programmable" if its passband may be varied in real time. The passband may be shifted up and down in frequency by varying the center frequency and preserving the bandwidth. However, the invention is not restricted to only this type of variation. It is also possible to keep the center frequency fixed and vary the bandwidth instead, or to vary both center frequency and bandwidth.

An "analog continuous-time" signal is a signal that is not quantized, neither in amplitude nor time.

A "discrete-time" signal is a signal that is quantized in time, i. e. it only exists at certain time instances (a sampled signal). Note that a discrete-time signal may or may not be quantized in amplitude. If it is not amplitude quantized its amplitude will be analog but only defined at certain time instances.

A "digital" signal is discrete-time signal in which the amplitude has also been quantized, thus it is quantized in both time and amplitude.

Similarly, an "analog" filter is a filter that receives an analog continuous-time signal and delivers an analog continuous-time signal.

A "discrete-time" filter is a filter that receives discrete-time signal and delivers a discrete-time signal.

A "digital" filter is a filter that receives a digital signal and delivers a digital signal.

The basic idea of the present invention will now be described with reference to FIG. 1. The upper part of FIG.

1 illustrates a complex analog bandpass filter 10 with variable passband that we wish to realize. Filter 10 receives an analog input signal (which may or may not be complex) and delivers an analog output signal (which may or may not be complex). As noted above such programmable complex analog bandpass filters are difficult to realize. In accordance with the present invention analog filter 10 is replaced by a "black box" including blocks 12–20 in the lower part of FIG. 1. Externally this "black box" will have the same frequency response as filter 10, but internally it will be based on a digital filter solution, which will be described in detail below.

Figure 1:
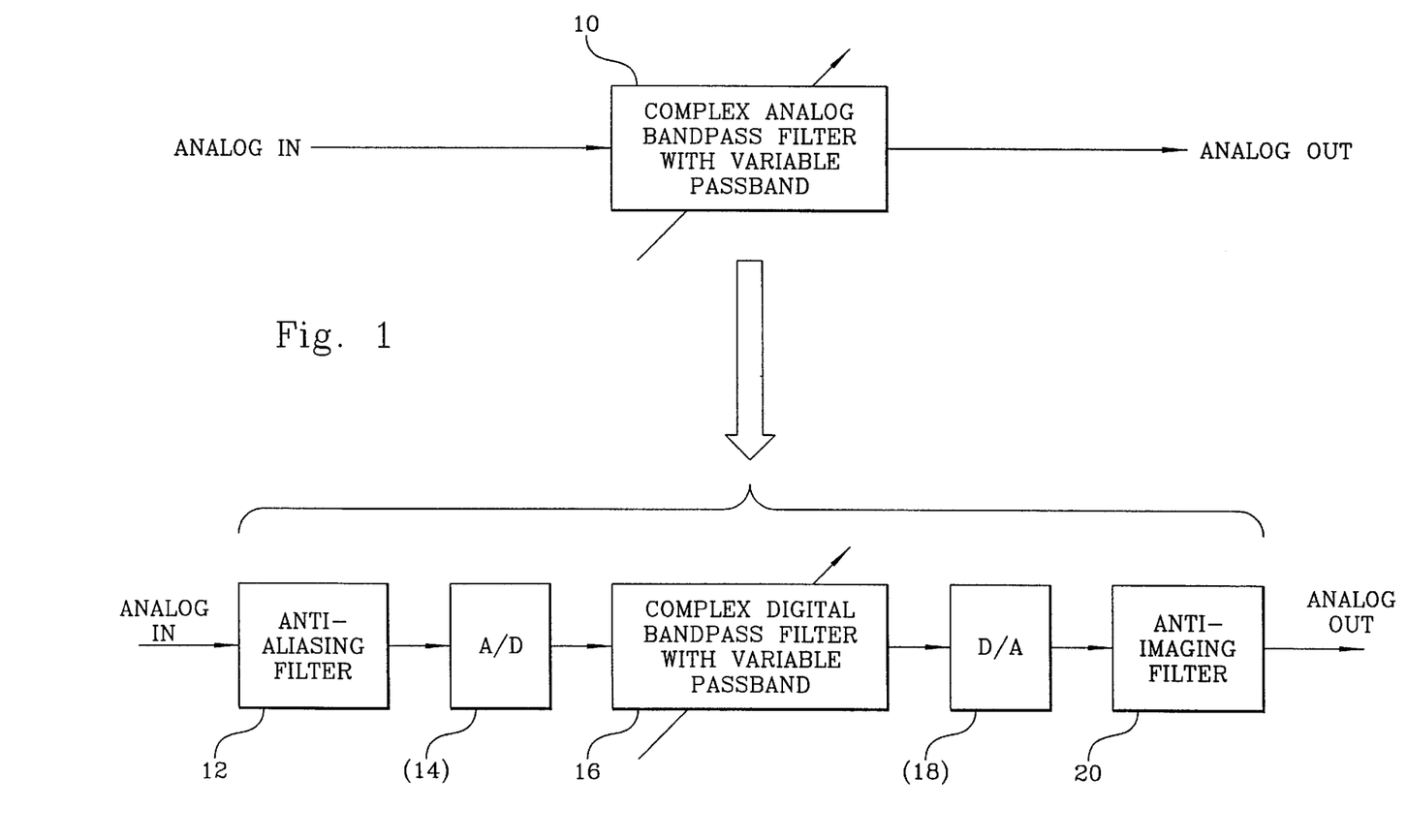
FIG. 1 is a block diagram illustrating the basic idea of the present invention.

The "black box" in FIG. 1 includes an analog anti-aliasing filter 12 for band-limiting the analog input signal. The band-limited analog signal is forwarded to an A/D-converter 14 (the reason for the parenthesis around reference designation 14 will be explained later) that converts it into a digital signal. This digital signal is filtered in a complex digital bandpass filter 16 with variable passband. The relation between filters 10 and 16 will be described in detail below. At this time it is sufficient to say that filter 16 realizes the programmability of the "black box" that is equivalent to filter 10. The digital output signal from filter 16 is forwarded to a D/A-converter 18 (the reason for the parenthesis around reference designation 18 will be explained later) that converts it into an analog signal. This analog signal is smoothed in an analog anti-imaging filter 20, from which the final output of the "black box" is obtained.

Figure 2:
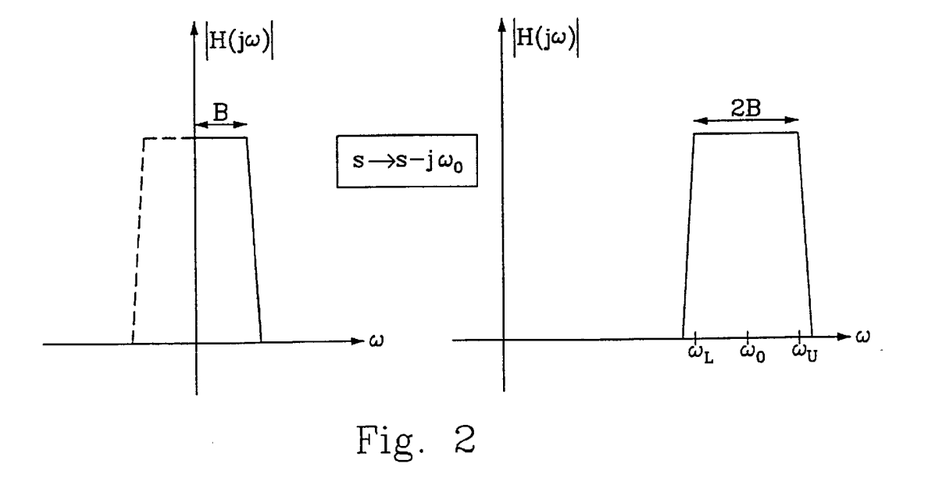
FIG. 2 is a diagram illustrating the effect of a frequency shift on the transfer function of an analog lowpass filter.

Starting point of the design of digital filter 16 is an analog lowpass filter. An example of the transfer function of such a filter having a bandwidth B is illustrated in the left half of FIG. 2. The lowpass filter is frequency shifted into an analog bandpass filter having the transfer function in the right half of FIG. 2. This frequency shifted bandpass filter, which has a bandwidth 2B and an upper and lower cut-off frequency of $\omega_U$ and $\omega_L$, respectively, is the filter that the programmable digital filter has to emulate. The transition is performed by a bilinear transformation from the s-domain to the z-domain.

As an illustrative example, consider a very simple continuous-time lowpass filter defined by the transfer function:

$$H_{LP}(s) = \frac{1}{s+1} \quad (1)$$

This reference filter is converted into a continuous-time bandpass filter—with center frequency $\omega_0$ by a simple frequency shift:

$$H_{BP}(s) = \frac{1}{s - j\omega_0 + 1} \quad (2)$$

Note that the frequency shifted bandpass filter is complex as mentioned above. This continuous-time complex bandpass filter corresponds to a discrete-time complex bandpass filter that is obtained through the bilinear transformation:

$$s = 2f_s \frac{1 - z^{-1}}{1 + z^{-1}} \quad (3)$$

where $f_s$ is the sampling frequency. Substituting (3) into (2) gives the equivalent discrete-time filter transfer function:

$$G_{BP}(z) = H_{BP}(s)\big|_{s=2f_s\frac{1-z^{-1}}{1+z^{-1}}} = \frac{1}{2f_s\frac{1-z^{-1}}{1+z^{-1}} - j\omega_0 + 1} \quad (4)$$

This may be simplified to the more familiar form:

$$G_{BP}(z) = \frac{1 + z^{-1}}{1 + 2f_s - j\omega_0 + (1 - 2f_s + j\omega_0)z^{-1}} \quad (5)$$

from which it is evident that the discrete-time bandpass filter is a complex filter.

Figure 5:
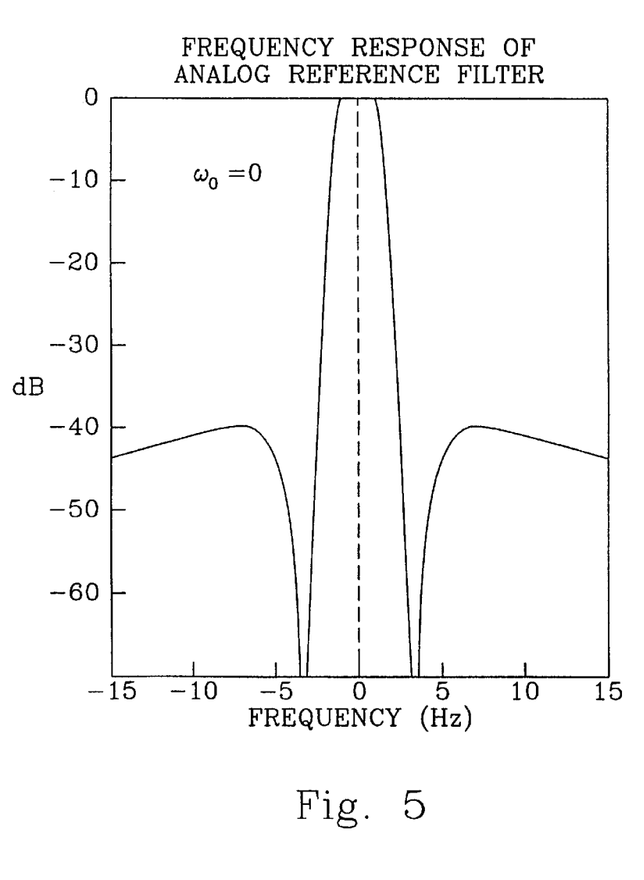
FIG. 5 is a diagram of the frequency response of the analog reference filter of FIG. 3.

As a more practical example a third order bandpass filter with complex coefficients in BDLF (BDLF=Bilinear Digital Ladder Filter) structure citation [4] will be designed. Starting point is a third order analog elliptic lowpass reference filter shown in FIG. 3. The stopband attenuation is 40.23 dB and the passband ripple is 0.18 dB. The actual component values of the reference filter in FIG. 3 may be looked up in a filter table (for the present example they are also given in the MATLAB program of the APPENDIX). The analog frequency response of the reference filter is shown in FIG. 5. This reference filter has the same characteristics as the actual filter to be realized, except for the cut-off frequency, which is normalized to 1 radian/second because the filter tables are normally standardized in this way.

In order to determine a corresponding discrete-time filter it is necessary to determine upper and lower normalized frequencies $v_U$ and $v_L$ that correspond to the upper and lower frequencies $\omega_U$ and $\omega_L$ of the analog filter that is to be realized. This is done by using the inverse of bilinear transformation (3). Equation (3) maps the imaginary axis in the s-plane into the unit circle in the z-plane, i.e.

$$s = 0 + j\omega \longrightarrow z = e^{j\pi v} \quad (6)$$

where v is the normalized frequency $f/f_s$ for the discrete-time case. In this case the bilinear transformation may be written:

$$\omega = 2f_s \tan(\pi v) \quad (7)$$

Inverting (7) gives:

$$v = \frac{1}{\pi}\tan^{-1}\left(\frac{\omega}{2f_s}\right) \quad (8)$$

According to (8) the cut-off frequencies $\omega_U$ and $\omega_L$ will be transformed into corresponding normalized cut-off frequencies $v_U$ and $v_L$ defined by:

$$v_U = \frac{1}{\pi}\tan^{-1}\left(\frac{\omega_U}{2f_s}\right) \quad (9)$$

and $$U_L = \frac{1}{\pi}\tan^{-1}\left(\frac{\omega_L}{2f_s}\right) \quad (10)$$

As mentioned above the reference filter has the property that it is frequency normalized, i.e. it has a cutoff angular frequency of 1 radian/second. In this case it is preferable to write the bilinear transformation in the form $$\omega = 2f_n \tan(\pi v) \quad (11)$$

where $f_n$ represents a frequency normalized sampling rate.

After frequency transformation of the analog reference filter we obtain a complex bandpass filter that is arithmetically symmetrical around the center (angular) frequency $\omega_0$ and has a bandwidth of $\omega_U - \omega_L = 2$ (since the reference filter was frequency normalized). This fact may be used to obtain an expression for $f_n$ in the following way. Using (11) gives $$\omega_U - \omega_L = 2 = 2f_n(\tan(\pi v_U) - \tan(\pi v_L)) \quad (12)$$

On the other hand, $\omega_0$ may be expressed as $$\omega_0 = \frac{\omega_U + \omega_L}{2} \quad (13)$$

Using the bilinear transformation again leads to $$\omega_0 = f_n(\tan(\pi v_L) + \tan(\pi v_U)) \quad (14)$$

Using (12) to eliminate $f_n$ leads to (after trigonometric simplification)

$$\omega_0 = \frac{\sin(\pi(v_U + v_L))}{\sin(\pi(v_U - v_L))} \quad (15)$$

This expression for $\omega_0$ will be used in the transformation equations that will be derived below for the digital BDLF filter that corresponds to an analog elliptic bandpass filter.

Figure 3:
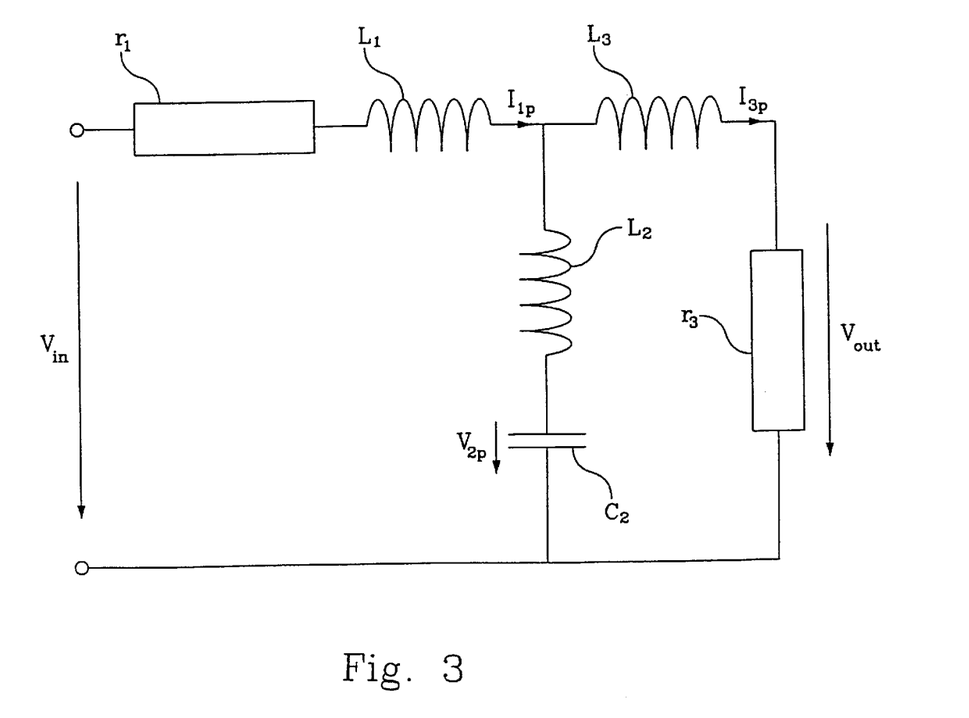
FIG. 3 is a circuit diagram of a third order elliptic lowpass reference filter that is used as the starting point of the filter transformation from continuous-time to discrete-time in accordance with the present invention.

After applying the frequency shift $s \rightarrow s - j\omega_0$ on the elliptic lowpass filter the following matrix representation of the corresponding analog bandpass filter is obtained (the meaning of the different parameters is evident from FIG. 3)

$$\begin{bmatrix} -1 & r_1 + (s - j\omega_0)(L_1 + L_2) & 1 & -(s - j\omega_0)L_2 \\ 0 & -1 & (s - j\omega_0)C_2 & 1 \\ 0 & -(s - j\omega_0)L_2 & -1 & r_3 + (s - j\omega_0)(L_2 + L_3) \end{bmatrix} \begin{bmatrix} V_{in} \\ I_{1p} \\ V_{2p} \\ I_{3p} \end{bmatrix} = \vec{0} \quad (16)$$

After bilinear transformation into the discrete-time domain and proper matrix operations (16) may be rewritten as $$\begin{bmatrix} -\tilde{p} & \frac{\tilde{q}}{\tau_1} + Z_1 & -1 + \frac{Y_2}{\mu}q & \kappa_2\tilde{q} - Z_2 \\ 0 & 1 & \mu q + Y_2 z^{-1} & 1 \\ 0 & \kappa_2\tilde{q} - Z_2 & -1 + \frac{Y_2}{\mu}q & \frac{\tilde{q}}{\tau_3} + Z_3 \end{bmatrix} \begin{bmatrix} V_{in} \\ I_1 \\ V_2 \\ I_3 \end{bmatrix} = \vec{0} \quad (17)$$

where $$Z_1 = r_1 - j\omega_0(L_1 + L_2) \quad (18)$$

$$Z_2 = j\omega_0 L_2$$

$$Z_3 = r_3 - j\omega_0(L_2 + L_3)$$

$$Y_2 = -j\omega_0 C_2$$

-continued $$\mu = \frac{Y_2}{2} + f_n C_2$$

$$\frac{1}{\tau_1} = \frac{Z_1}{2} + f_n(L_1 + L_2) + \frac{1}{4\mu}$$

$$\kappa_2 = -\frac{Z_1}{2} + f_n L_2 + \frac{1}{4\mu}$$

$$\frac{1}{\tau_3} = \frac{Z_3}{2} + f_n(L_2 + L_3) + \frac{1}{4\mu}$$

From (18) the following equations are obtained for the state variables $$I_1 = \frac{\tau_1}{\tilde{q}} \underbrace{(\tilde{p}V_{in} - Z_1 I_1 + V_2 + Z_2 I_3)}_{X_1} - \kappa_2\tau_1 I_3 - z^{-1}\frac{Y_2\tau_1}{\mu}V_2 \quad (19)$$

$$V_2 = \frac{-1}{\mu q + Y_2 z^{-1}} \underbrace{(I_1 + I_3)}_{X_2}$$

$$I_3 = \frac{\tau_3}{\tilde{q}} \underbrace{(-Z_2 I_3 + V_2 + Z_2 I_1)}_{X_3} - \kappa_2\tau_3 I_1 - z^{-1}\frac{Y_2\tau_3}{\mu}V_2$$

Figure 4:
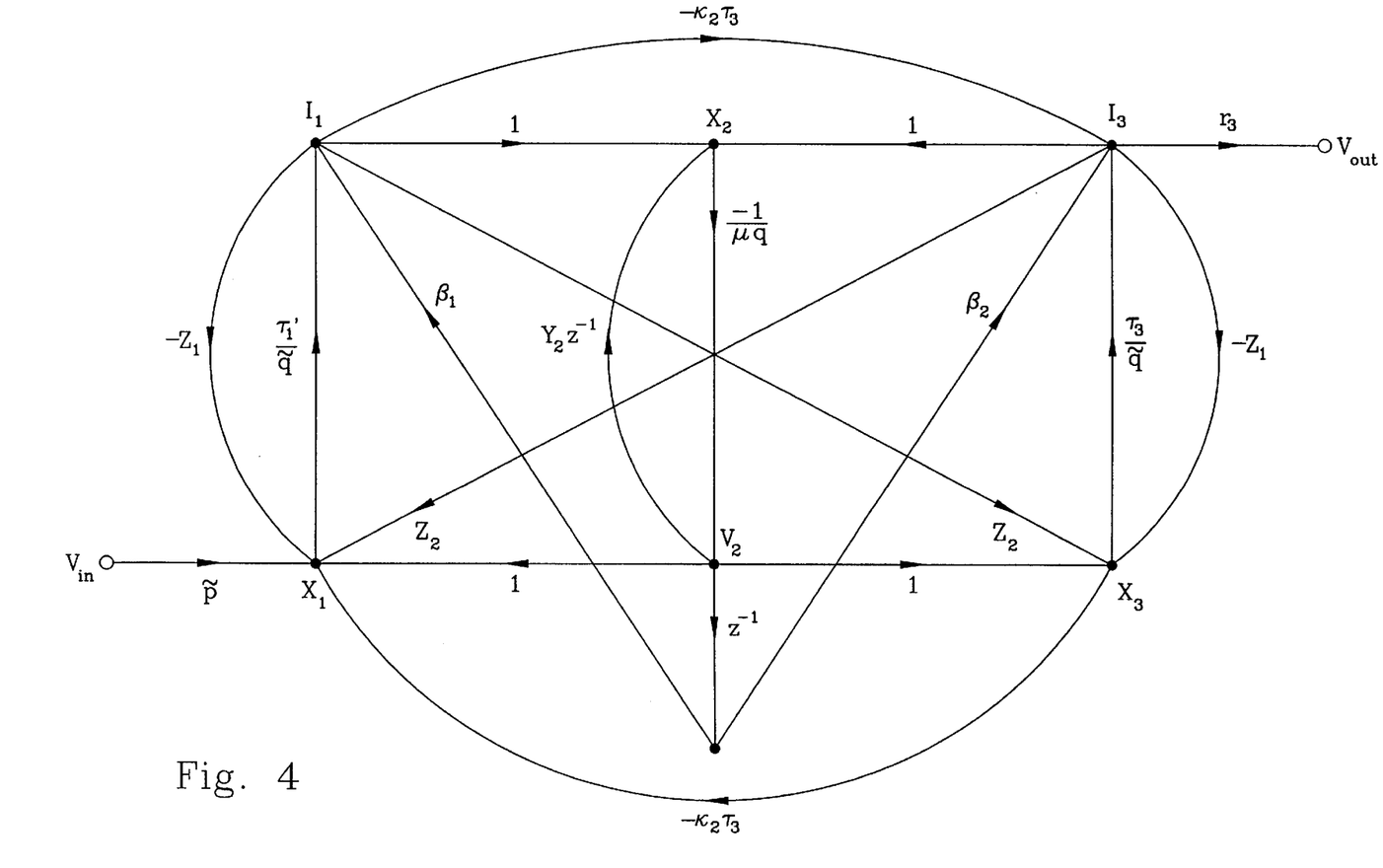
FIG. 4 is signal flow graph of a complex bilinear digital ladder filter that replaces the bandpass filter that is based on the reference filter in FIG. 3.

Unfortunately (19) results in a delay-free loop between $I_1$ and $I_3$, which makes the corresponding digital filter non-realizable. In order to eliminate this delay-free loop the equation for $I_3$ in (19) is inserted into the equation for $I_1$ $$I_1 = \frac{\tau_1'}{\tilde{q}}\underbrace{(X_1 - \kappa_2\tau_3 X_3)}_{X_1'} + z^{-1}\underbrace{\frac{\tau_1' Y_2}{\mu}(\kappa_2\tau_3 - 1)V_2}_{\beta_1} \quad (20)$$

where $\tau_1' = \tau_1/(1 - \kappa_2^2\tau_1\tau_3)$. Furthermore, by defining $\beta_2 = -Y_2\tau_3/\mu$ a realizable digital filter is obtained, the flow graph of which is shown in FIG. 4.

The transformation process of this example from an analog to a corresponding digital BDLF filter is further illustrated by the MATLAB code in the APPENDIX.

The correspondence between the analog filter and the equivalent BDLF filter will now be illustrated with reference to FIGS. 5–12. In all the illustrated cases a sampling frequency of 20 Hz is assumed.

Figure 6:
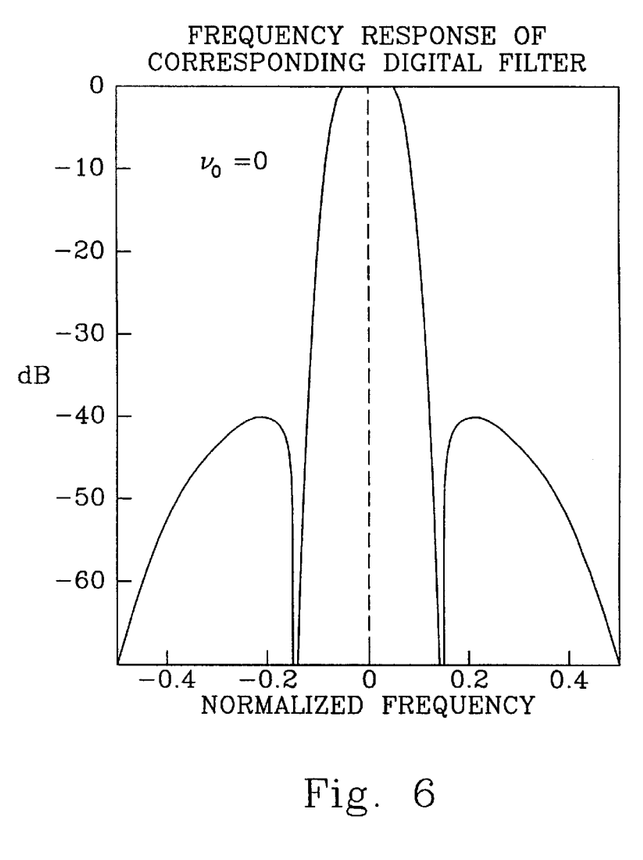
FIG. 6 is a diagram of the frequency response of the digital filter that corresponds to the frequency response of FIG. 5.

FIG. 5 is a diagram of the frequency response of the analog reference filter of FIG. 3 and FIG. 6 is a diagram of the frequency response of the BDLF filter that corresponds to that filter. Here both filters have zero center frequency and are symmetric around this center frequency.

Figure 7:
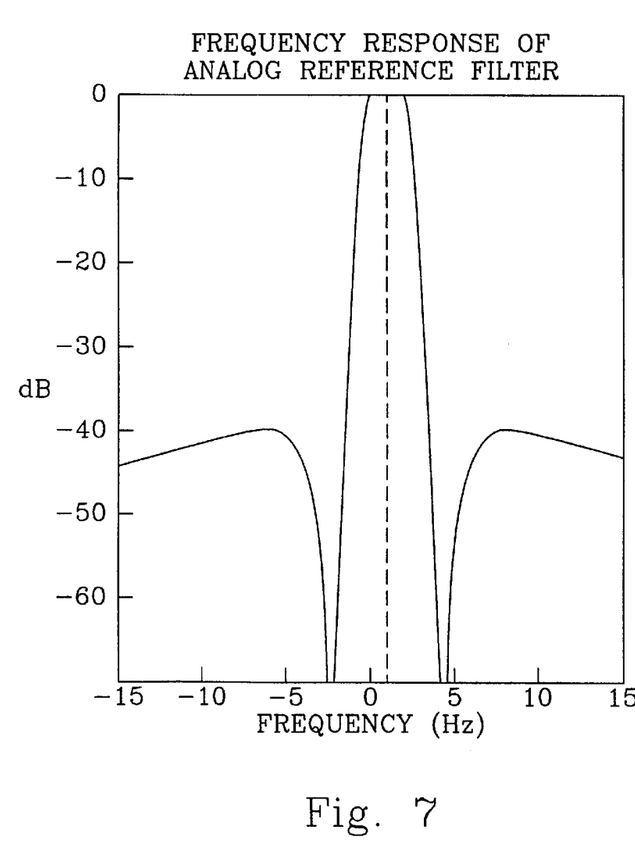
FIG. 7 is a diagram of the frequency response of the analog reference filter of FIG. 3 shifted to a center frequency of 1 Hz.
Figure 8:
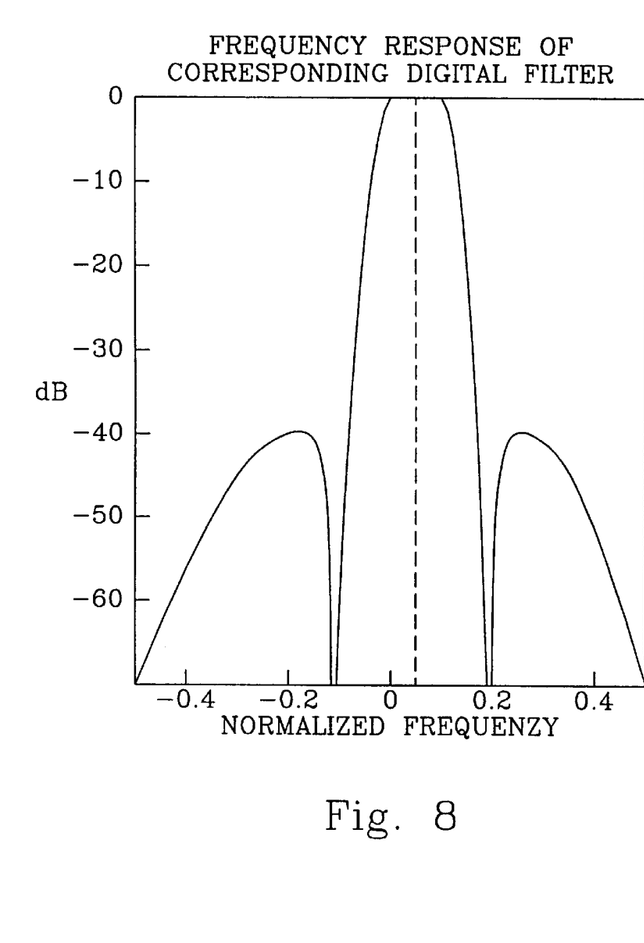
FIG. 8 is a diagram of the frequency response of the digital filter that corresponds to the frequency response of FIG. 7.

FIG. 7 is a diagram of the frequency response of the analog reference filter of FIG. 3 shifted to a center frequency of 1 Hz and FIG. 8 is a diagram of the frequency response of the corresponding BDLF filter. In this case the analog filter is still symmetric around the center frequency, but the digital filter starts to become asymmetric.

Figure 9:
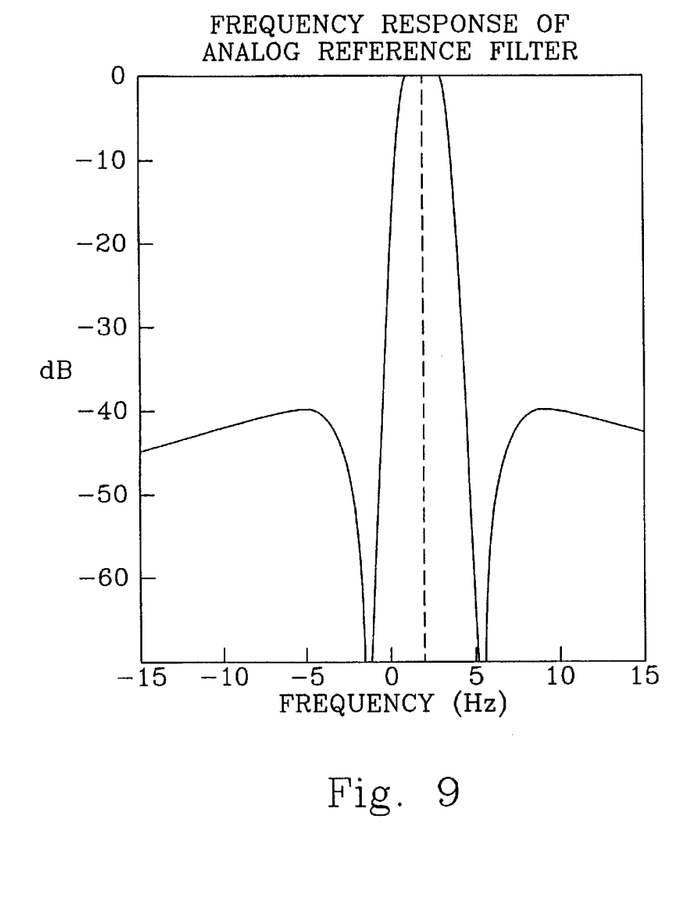
FIG. 9 is a diagram of the frequency response of the analog reference filter of FIG. 3 shifted to a center frequency of 2 Hz.
Figure 10:
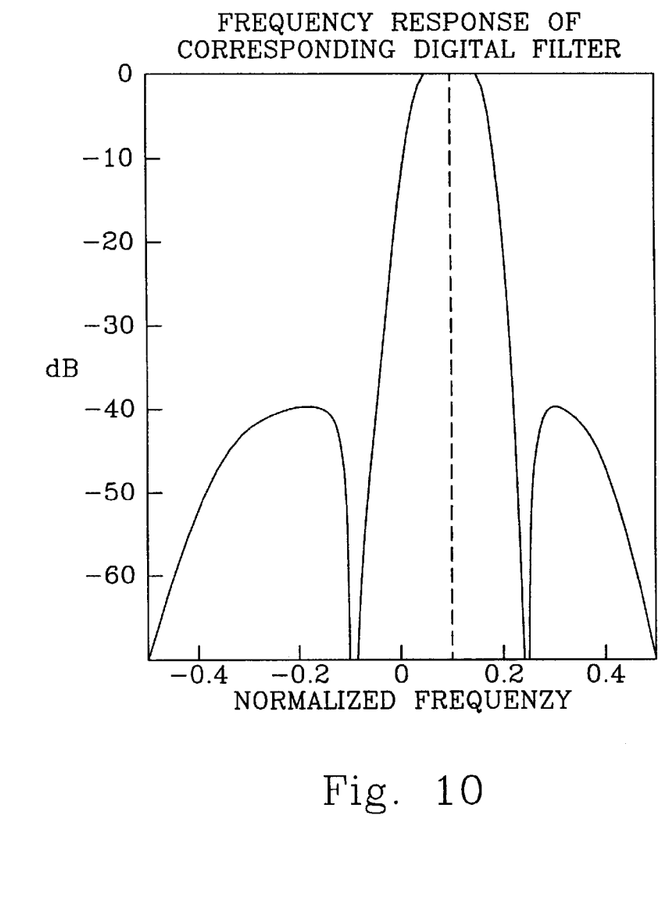
FIG. 10 is a diagram of the frequency response of the digital filter that corresponds to the frequency response of FIG. 9.

FIG. 9 is a diagram of the frequency response of the analog reference filter of FIG. 3 shifted to a center frequency of 2 Hz and FIG. 10 is a diagram of the frequency response of the corresponding BDLF filter. The analog filter is still symmetric around the center frequency, but the digital filter is more asymmetric than for the previous case.

Figure 11:
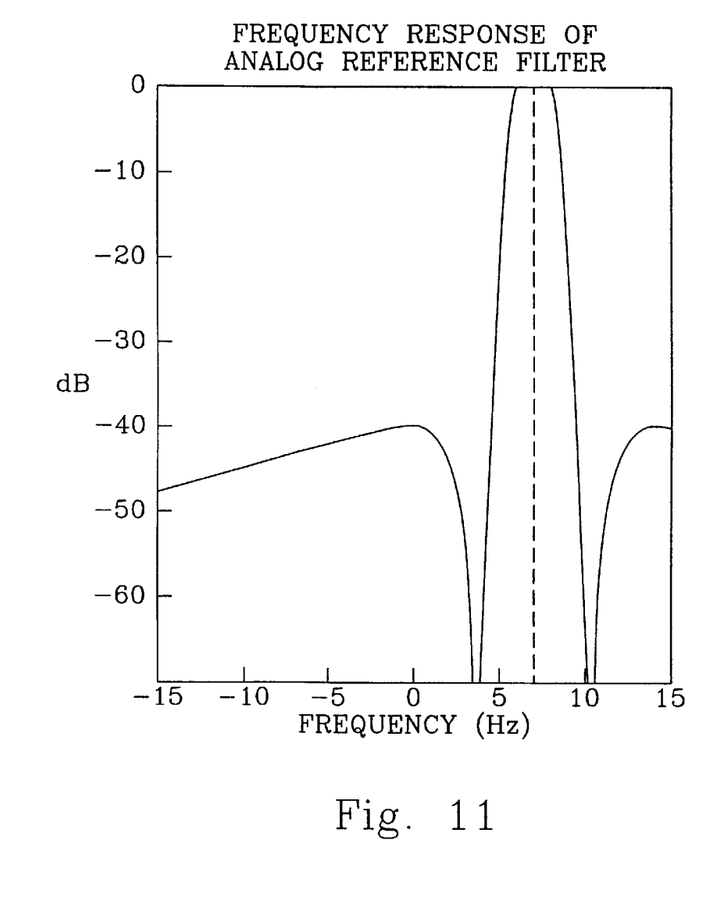
FIG. 11 is a diagram of the frequency response of the analog reference filter of FIG. 3 shifted to a center frequency of 7 Hz.
Figure 12:
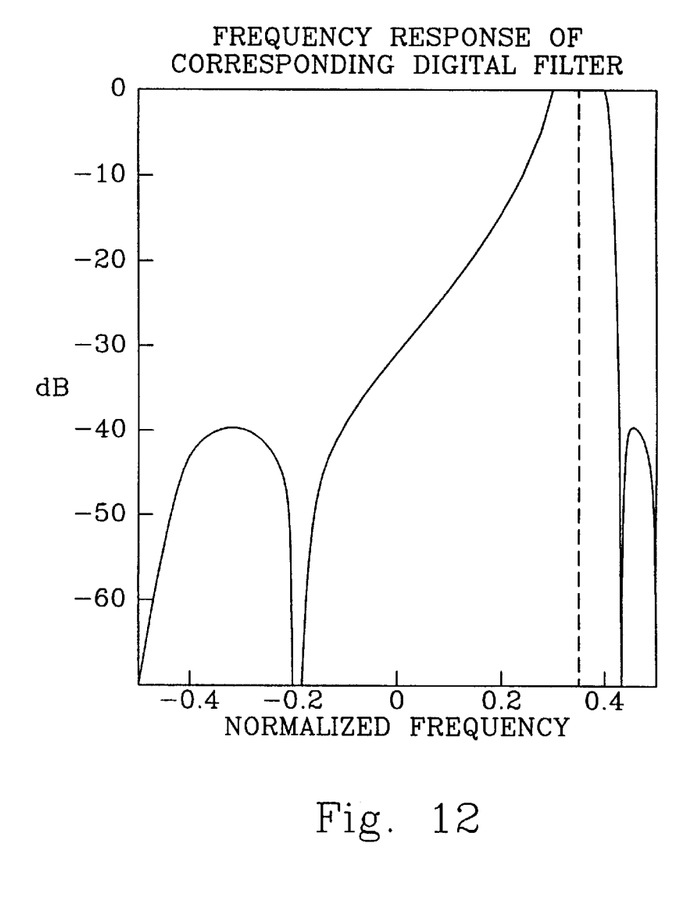
FIG. 12 is a diagram of the frequency response of the digital filter that corresponds to the frequency response of FIG. 11.

FIG. 11 is a diagram of the frequency response of the analog reference filter of FIG. 3 shifted to a center frequency of 7 Hz and FIG. 12 is a diagram of the frequency response of the corresponding BDLF filter. The analog filter is still symmetric around the center frequency, but the digital filter is very asymmetric.

In all the illustrated cases the analog filter remains symmetrical (as desired) even though the BDLF filter may be very asymmetric.

Figure 13:
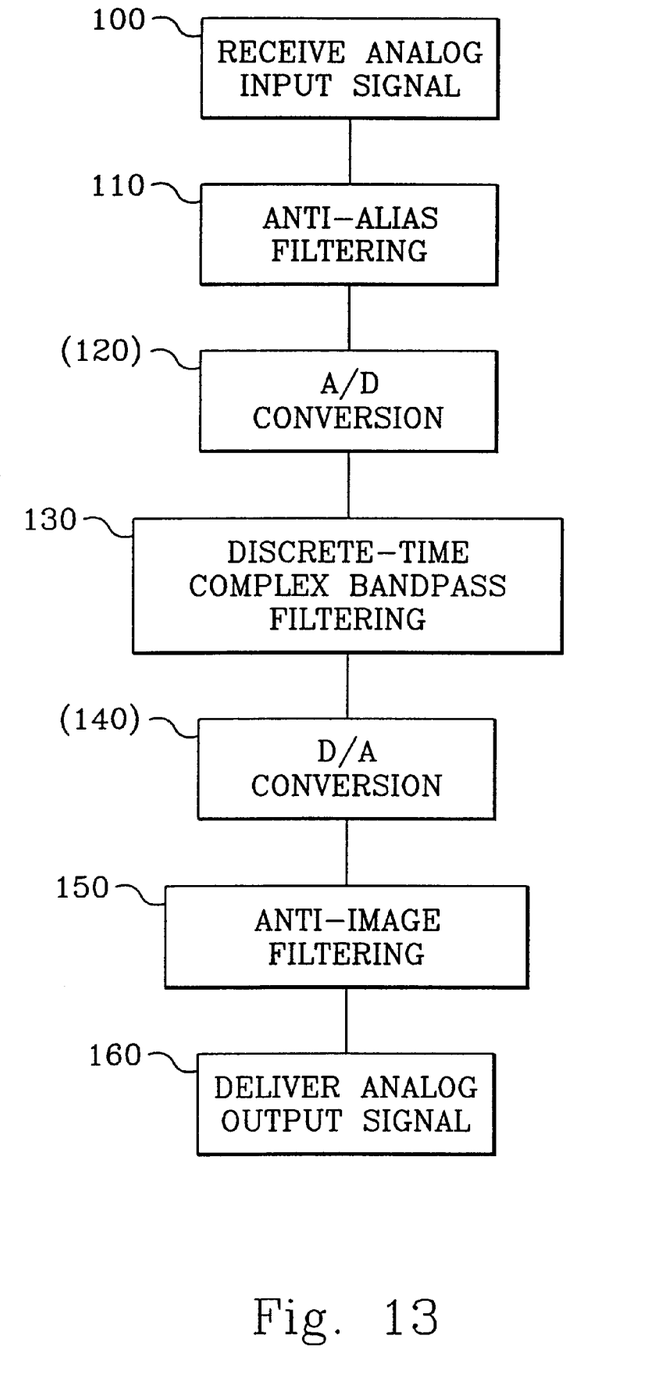
FIG. 13 is a flow chart illustrating the method in accordance with the present invention.

A flow chart illustrating the method in accordance with the present invention is shown in FIG. 13. In step 100 the analog input signal is received. In step 110 this input signal is filtered in an analog anti-aliasing filter for band-limiting the analog input signal. In step 120 the band-limited analog signal is A/D-converted (the reason for the parenthesis around reference designation 120 will be explained below) into a digital signal. In step 130 this digital signal is filtered in a complex digital bandpass filter with variable passband. In step 140 the digital output signal from the filtering step is D/A-converted (the reason for the parenthesis around reference designation 140 will be explained below) that converts it into an analog signal. In step 150 his analog signal is smoothed in an analog anti-imaging filter, from which the final output is obtained in step 160.

From the above discussion it is clear that nowhere was it actually required that the discrete-time filter must be digital. Thus an embodiment without A/D-converter 14 and D/A-converter 18 (or without steps 120 and 140) is possible, provided discrete-time filter 16 operates on a discrete-time signal and outputs a discrete-time signal. Such filters may be implemented in well known switched capacitor or switched current techniques.

In the above example an analog elliptic reference filter was used as a starting point in the derivation of a corresponding complex digital filter. However, the invention is not restricted to elliptical filters. The above described principles may also be used for other types of analog reference filters, such as Butterworth or Chebyshev filters. Similarly, the invention is not restricted to complex BDLF filters. Other types of complex digital filters, such as wave digital filters (WDF) or cascade-form digital filters are also possible.

It will be understood by those skilled in the art that various modifications and changes may be made to the present invention without departure from the spirit and scope thereof, which is defined by the appended claims.

APPENDIX

% MATLAB program for simulation of realization of analog filters by BDLF-filters with % complex coefficients.
clear
% Parameters for 3rd order RLC reference filter; Cauer, 0.18 dB ripple, stopband % attenuation 40.23 dB
r1=1;
L1=1.1395;
C2=1.0844;
L2=0.0669;
L3=1.1395;
r3=1;
% Input sampling frequency fs
fs=input('Sampling frequency:');
if length(fs)==0
    fs=20.0
end
% Lower cutoff frequency
f_lower=input('Desired lower analog cut-off frequency:');
if length(flower)==0
    f_lower=1.0
end
w_lower=2*pi*f_lower;
ny_lower=1/pi*atan(w_lower/(2*fs));
% Upper cutoff frequency
f_upper=input('Desired upper analog cut-off frequency:');
if length(f_upper)==0
    f_upper=2.0
end
w_upper=2*pi*f_upper;
ny_upper=1/pi*atan(w_upper/(2*fs));
% Normalized sampling frequency:
fn=1/(tan(pi*ny_upper)−tan(pi*ny_lower))
% Transformation frequency:
w0=sin(pi*(ny_upper+ny_lower))/sin(pi*(ny_upper−ny_lower))
% 3rd order BDLF.
y2=−j*w0*C2;
z2=j*w0*L2;
z1=r1−j*w0*(L1+L2);
z3=r3−j*w0*(L2+L3);
my=fn*C2+y2/2;
tau1=fn*(L1+L2)+1/(4*my)+z1/2;
tau1=1/tau1;
tau2=1/my;
tau3=fn*(L3+L2)+1/(4*my)+z3/2;
tau3=1/tau3;
kappa2=fn*L2+1/(4*my)−z2/2;
% Backward elimination:
tau3p=tau3;
tau2p=tau2;
tau1p=tau1/(1−kappa2^2*tau3p*tau1);
alpha=kappa2*tau3p;
beta1=tau2p/4*(tau3p*kappa2−1)*y2;
beta2=tau2p*tau3p/4*y2;
% Equations
vin_old=0;
i1=0;
v2=0;
i3=0;
x1=0;
x2=0;
x3=0;
vin=1;
a1=0;
a3=0;
vout=zeros(1,npoints);
npoints=1024;
for i=1:npoints
    i1=a1+tau1p*beta1*v2;
    i3=a3−alpha*i1−beta2*v2;
    x2=i1+i3+y2*v2;
    v2=v2−tau2p*x2;
    x3=v2−z3*i3+z2*i1;
    x1=vin+vin_old+v2−alpha*x3−z1*i1+z2*i3;
    vin_old=vin;
    a1=a1+tau1p*x1;
    a3=a3+tau3p*x3;
    vout(i)=i3*r3;
    vin=0;
end

CITATIONS

[1] U.S. Pat. No. 4,232,269 (G. Willoner)
[2] SU "Author's Certificate" 1 555 825 (A. G. Ostapenko et al)
[3] EP 0 489 281 A2
[4] S. Signell et al, "Design and Analysis of Bilinear Digital Ladder Filters", IEEE CAS-I, vol 43, February 1996

What is claimed is:

1. A signal filtering apparatus having a continuous-time frequency response function and including means for converting an analog continuous-time input signal into a discrete-time signal, means for discrete-time filtering said discrete-time signal into a filtered discrete-time signal and means for converting said filtered discrete-time signal into an analog continuous-time output signal, wherein said discrete-time filtering means is implemented by:

programmable and linear frequency shifting a continuous-time prototype lowpass filter frequency response function into a complex continuous-time bandpass filter frequency response function; and bilinearly transforming said complex continuous-time bandpass filter frequency response function into a programmable complex discrete-time bandpass filter frequency response function.

2. The apparatus of claim 1, including:

an analog anti-aliasing filter for band-limiting the analog continuous-time input signal; and an analog anti-imaging filter for smoothing the analog continuous:time output signal.

3. The apparatus of claim 2, including:

an A/D converter for converting the analog continuous-time input signal into a digital signal;

a complex digital bandpass filter for filtering said digital signal into a filtered digital signal; and a D/A converter for converting said filtered digital signal into the analog continuous-time output signal.

4. The apparatus of claim 3, wherein said continuous-time prototype lowpass filter frequency response function defines an elliptic filter and said discrete-time frequency response function defines a complex bilinear digital ladder filter.

5. The apparatus of claim 2, including a switched capacitor filter for filtering said discrete-time signal into said filtered discrete-time signal.

6. The apparatus of claim 2, including a switched current filter for filtering said discrete-time signal into said filtered discrete-time signal.

7. A signal filtering method defining a continuous-time frequency response function and including the steps of converting an analog continuous-time input signal into a discrete-time signal, discrete-time filtering said discrete-time signal into a filtered discrete-time signal and converting said filtered discrete-time signal into an analog continuous-time output signal, wherein said discrete-time filtering step is defined by a frequency response function which is obtained by:

programmable and linear frequency shifting a continuous-time I prototype owpass filter frequency response function into a complex continuous-time bandpass filter frequency response function; and bilinearly transforming said complex continuous-time bandpass filter frequency response function into a programmable complex discrete-time bandpass filter frequency response function.

8. The method of claim 7, including:

band-limiting the analog continuous-time input signal in an analog anti-aliasing filter; and smoothing the analog continuous-time output signal in an analog anti-imaging filter.

9. The method of claim 8, including:

A/D converting said band-limited analog continuous-time input signal into a digital signal;

filtering said digital signal into a filtered digital signal in a complex digital band pass filter; and D/A converting said filtered digital signal into the analog continuous-time output signal.

10. The method of claim 9, wherein said continuous-time prototype lowpass filter frequency response function defines an elliptic filter and said programmable complex discrete-time bandpass filter frequency response function defines a complex bilinear digital ladder filter.

11. The method of claim 8, including filtering said discrete-time signal into said filtered discrete-time signal in a switched capacitor filter.

12. The method of claim 8, including filtering said discrete-time signal into said filtered discrete-time signal in a switched current filter.

13. A discrete-time filter design method, comprising:

programmable and linear frequency shifting a continuous-time prototype lowpass filter frequency response function into a complex continuous-time bandpass filter frequency response function; and bilinearly transforming said complex continuous-time bandpass filter frequency response function into a programmable complex discrete-time bandpass filter frequency response function defining the discrete-time filter.

\* \* \* \* \*

UNITED STATES PATENT AND TRADEMARK OFFICE
CERTIFICATE OF CORRECTION

PATENT NO.     :   6,032,166

DATED          :   February 29, 2000

INVENTOR(S)    :   Svante SIGNELL et al.

It is certified that error appears in the above-identified patent and that said Letters Patent is hereby corrected as shown below:

On the Title Page item:

[30] Foreign Application Priority Data, please delete "970045" and insert therefor --9700454--

Signed and Sealed this

Twenty-seventh Day of March, 2001

Attest:

NICHOLAS P. GODICI

Attesting Officer

Acting Director of the United States Patent and Trademark Office